United States Patent [19]

Geissler et al.

[11] Patent Number: 4,835,481
[45] Date of Patent: May 30, 1989

[54] CIRCUIT ARRANGEMENT FOR GENERATING A CLOCK SIGNAL WHICH IS SYNCHRONOUS IN RESPECT OF FREQUENCY TO A REFERENCE FREQUENCY

[75] Inventors: Friedrich Geissler, Munich; Eduard Zwack, Puchheim; Juergen Heitmann, Munich, all of Fed. Rep. of Germany

[73] Assignee: Siemens Aktiengesellschaft, Berlin and Munich, Fed. Rep. of Germany

[21] Appl. No.: 93,595

[22] Filed: Sep. 8, 1987

[30] Foreign Application Priority Data

Sep. 30, 1986 [DE] Fed. Rep. of Germany ....... 3633189

[51] Int. Cl.⁴ .......................... H03K 5/13; H03K 5/22
[52] U.S. Cl. ...................................... 328/155; 328/63; 328/72; 328/133; 307/269; 331/18
[58] Field of Search .................. 328/63, 72, 155, 133; 307/269; 331/12, 18

[56] References Cited

U.S. PATENT DOCUMENTS 3,602,828  8/1971  Kurzwell, Jr. .................. 328/109
4,205,277  5/1980  Poinas .............................. 331/12
4,538,110  8/1985  Hollaar et al. .................. 307/269
4,686,482  8/1987  Zoetman et al. ................ 307/269
4,695,805  9/1987  Massingill et al. .............. 307/269

Primary Examiner—Stanley D. Miller
Assistant Examiner—Richard Roseen
Attorney, Agent, or Firm—Hill, Van Santen, Steadman & Simpson

[57] ABSTRACT

In addition to a filter phase comparator, an integrator, a first filter and a voltage-controlled oscillator of relatively low stability and having a wide pull-in range, a circuit arrangement for generating a clock signal comprises a frequency generator of high stability having a narrow pull-in range, a second phase comparator and second and third filters. The first phase comparator is supplied with the reference frequency and the clock signal emitted by the voltage-controlled oscillator. The second phase comparator is supplied with the clock signal and a normal frequency generated by a normal frequency generator. In the event of the failure of the reference frequency or the overshooting of predetermined phase difference values, a regulating circuit formed by the second phase comparator, the second filter, the third filter and the voltage-controlled oscillator is closed.

3 Claims, 2 Drawing Sheets

CIRCUIT ARRANGEMENT FOR GENERATING A CLOCK SIGNAL WHICH IS SYNCHRONOUS IN RESPECT OF FREQUENCY TO A REFERENCE FREQUENCY

BACKGROUND OF THE INVENTION

1. Field of the Invention

The present invention relates to a circuit arrangement for generating a clock signal which is synchronous in respect of frequency to a supplied reference frequency, comprising a reference frequency receiving component which receives an external signal having a reference frequency and which is connected to a first input of a first phase comparator, the first phase comparator being connected by way of an integrator to a first filter and the first filter being connected to a following voltage-controlled oscillator which emits the frequency-synchonrous clock signal to the output of the circuit arrangement and to a second input of the first phase comparator.

2. Description of the Prior Art

In specific transmission devices, clock signals must be generated in dependence upon a supplied reference frequency. The frequency of the clock signal is equal to the reference frequency, or the clock signal frequency bears a different fixed mathematical ratio to the reference frequency. Disturbances in the reference frequency which occur on the transmission link, for example, due to temperature influences or electromagnetic influences, are to influence the generated clock signal to the least possible extent.

In order to generate a clock signal which is frequency-synchronous to a reference frequency, and in order to suppress disturbances in the reference frequency, the usual practice is to employ phase-regulating circuits including an oscillator. Here, the pull-in range of the circuit arrangement which generates the clock signal is limited to the pull-range of the oscillator used in the phase-regulating circuit. In the case of highly-stable oscillators, which are desirable per se, the pull-range is very small; normally it is only slightly larger than the actual inaccuracy.

Circuit arrangements are also known which employ a less stable oscillator with a wide pull-in range and a highly-stable oscillator. In the event of the failure of the reference frequency, a transfer takes place from the less-stable oscillator with the wide pull-in range to the highly-stable oscillator with the small pull-in range. These circuit arrangements are limited to applications in which the reference frequency changes only with in a small fluctuation range. Because the transfer from the less-stable oscillator to the highly-stable oscillator results in a frequency jump which destroys the frequency synchronism between the last-supplied reference frequency and the new clock signal.

SUMMARY OF THE INVENTION

The object of the present invention is to provide a circuit arrangement for generating a clock signal which is frequency-synchronous to a signal having a reference frequency, which does not influence the reference frequency in the event of changes in the reference frequency within a predetermined range, but in the event of the failure of the reference frequency, generates a clock signal which is frequency-synchronous to the last-supplied reference frequency.

The above object is achieved, according to the present invention, in a circuit arrangement for generating a clock signal which receives an external signal having a reference frequency by way of a reference frequency receiving component which is connected to a first input of a first phase comparator. The first phase comparator can be connected by way of an integrator to a first filter and the first filter can be connected to a following, voltage-controlled oscillator which emits the frequency-synchronous clock signal to the output of the circuit arrangement and to a second input of the first phase comparator. The arrangement is particularly characterized in that it comprises a second phase comparator having a first input to which a highly-stable normal frequency generator is connected and a second input to which the output of the voltage-controlled oscillator is connected. The second phase comparator is followed by a first switching element which can be controlled by the reference frequency receiving component, the first phase comparator, or the integrator, and has two outputs. In the event of the failure of the reference frequency or in the event of the overshooting of a predetermined phase difference between the reference frequency signal and the clock signal, the first switching element transfers from a first switch position to a second switch position and thereby connects the second phase comparator to the subtrahend input of a first subtractor whose output is connected to a second filter. A third filter is arranged between a first output of the first switching element an the minuend input of the first subtractor. The first filter is connected to the first input of a second switching element which is synchronous with the first switching element and whose second input is connected to the output of the second filter. The output of the second switching element is connected to the voltage-controlled oscillator.

The circuit arrangement of the present invention has the advantage that it also generates frequency-synchronous clock signals for reference frequencies which change within a relatively large range of fluctuation around a predetermined nominal frequency. The circuit arrangement is additionally characterized by the advantage that the frequency-synchronous clock signal acquires a high level of stability.

BRIEF DESCRIPTION OF THE DRAWINGS

Other objects, features and advantages of the invention, its organization, construction and operation, will be best understood from the following detailed description, taken in conjunction with the accompanying drawings, in which.

DESCRIPTION OF THE PREFERRED EMBODIMENTS

Figure 1:
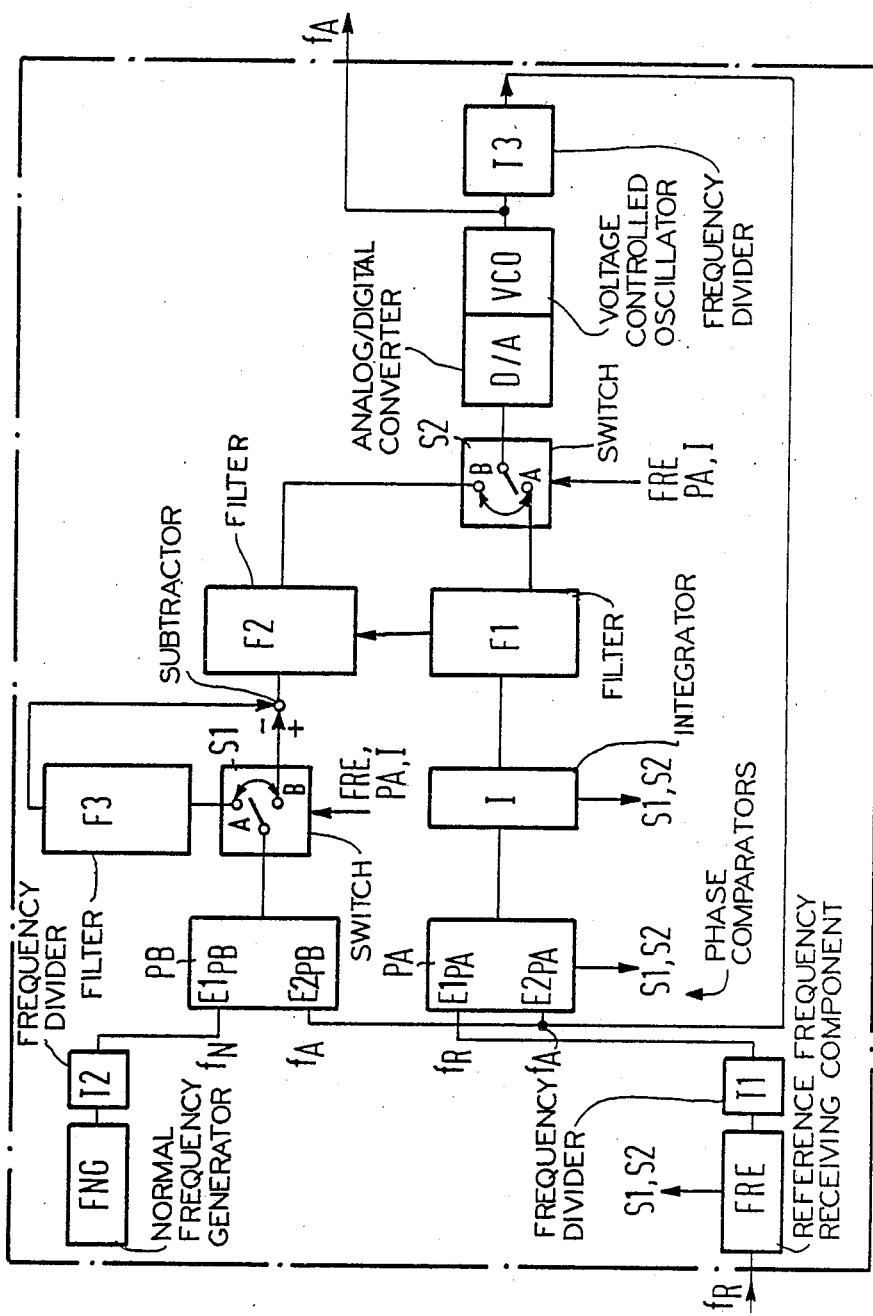
FIG. 1 is a schematic representation of a first circuit arrangement constructed in accordance with the present invention.

The first circuit arrangement illustrated in FIG. 1 comprises a reference frequency receiving component FRE at its input side. The reference frequency receiving component FRE is supplied with an external reference frequency signal FR which is temporarily subject to frequency deviations which represent disturbances. The circuit arrangement is also provided at its input side with a normal frequency generator FNG that generates a normal frequency signal $f_N$. The reference frequency receiving component FRE and the normal frequency generator FNG are connected to a first input $E1_{PA}$ of a first phase comparator PA and $E1_{PB}$ of a second phase comparator PB, respectively. The first phase comparator PA is connected by way of an integrator I to a first filter F1, and the second phase comparator PB is connected by way of a first switching element S1 to a second filter F2. As will be explained hereinbelow, the first switch S1 can be controlled by the reference frequency receiving component FRE. The first and second filters F1 and F2 are followed by a second switch S2 which can likewise be controlled by the reference frequency receiving component FRE and which is connected at its output to a voltage-controlled oscillator VCO which, in some cases, is preceded by a digital/analog converter DA. The oscillator VCO generates the clock signal or the output frequency signal $f_A$ which is emitted at the output of the circuit arrangement corresponding to the present invention for further processing. The clock signal or output frequency signal $f_A$ is also connected to the respective second inputs $E2_{PA}$, $E2_{PB}$ of the first and second phase comparators PA and PB, respectively.

The oscillator VCO has only a low level of stability and has a wide pull-in range which corresponds at least to the range of fluctuation of the reference frequency $f_R$ around its nominal value.

The normal frequency generator FNG, the reference frequency receiving component FRE and the voltage-controlled oscillator VCO can be followed by arrangements which produce an arbitrary division factor of the respectively supplied frequencies. In the exemplary embodiment illustrated in FIG. 1, division circuits T1,T2 and T3 are arranged at the respective outputs of the devices FRE, FNG and VO..

A third filter F3 and a subtractor are arranged between the first switch S1 and the second filter F2.

The external reference frequency signal $f_R$ is supplied to the reference frequency receiving component FRE which switches through the reference frequency signal $f_R$, following matching where necessary, for further processing to the first input $E1_{PA}$ of the first phase comparator PA. The second input $E2_{PA}$ of the first phase comparator PA is supplied with the output signal $f_A$ which is formed by the circuit arrangement and which, when the reference frequency signal $f_R$ is undisturbed, is equal to the frequency of the reference frequency signal $f_R$, and which is the event of a disturbance is formed in dependence upon a disturbed or changed reference frequency signal $f_R$.

For specific, uniformly identical sampling time intervals $\Delta t$, the first phase comparator PA determines the phase difference between the two input signals $f_R$ and $f_A$. The comparator PA first stores the value of a first phase difference for a time $t_1$, and compares this first value with the value of a second phase difference which occurs at a second time $t_2$, following the first time $t_1$, at its inputs. The difference between the two values designates the change in the phase difference during the time interval between the time $t_1$ and the time $t_2$.

The difference value is supplied to the following integrator I which reforms the phase difference value by integration. This method of differentiation followed by integration is selected in order to carry out the difference formation with simple circuitry. Furthermore, this method permits phase differences of more than 360° and more than one period duration T to be recognized.

In dependence upon the supplied phase difference values, the filter F1 forms control variables for driving the voltage-controlled oscillator VCO.

If, when the arrangement is in the steady state, no phase difference occurs at the input of the first phase comparator PA, and therefore the frequency of the reference frequency signal $f_R$ externally supplied to the circuit is equal to the frequency of the output frequency signal $f_A$ formed within the circuit, the filter F1 forms a sequence of first control variables for the oscillator VCO, which first control variables are maintained constant.

As already mentioned above, the second switch S2, arranged between the first filter F1 and the oscillator VCO, can be controlled by the reference frequency receiving component FRE. In the event of a failure of the reference frequency signal $f_R$, the receiving component FRE changes the switch S2 from the position A to the position B. This transfer can also be implemented by the first phase comparator PA when a given threshold value $\Delta\phi s/\Delta t$ is overshot or by the integrator I when a predetermined threshold value $\Delta\phi s$ is overshot. In the same manner as the switch S2, the first switch S1 can be controlled by the reference frequency receiving component FRE, the first phase comparator PA or the integrator I. Both of the switches S1 and S2 have two switching positions A and B. At any time the two switches S1 and S2 occupy the same position A or B.

When the phase difference values occur at the input of the filter F1, caused for example by disturbances which influence the oscillator VCO or by changes in the external reference frequency signal $f_R$ which represent disturbances, the filter F1 forms a sequence of second control variables for the oscillator VCO. This sequence of control second variables is contrived to be such that in the steady state the oscillator VCO generates signals $f_{A1}, f_{A2}, \ldots,$ FAn having frequencies which lead to a phase difference to zero with the changed reference frequency signal $f'_R$.

The filter F1 can consist of, for example, a P-, PI-, or PID-filter having proportional, proportional and integrator, or proportional, integrator, and differentiator characteristics, respectively. To determine the transient response in the regulating circuit, which is formed by the first phase comparator PA, the integrator I, the filter F1, the switch S2 (in the position A), and in some cases a digital/analog converter D/A, and the voltage-controlled oscillator VCO, filter type and filter constants are selected in a manner known per se.

If the control variable emitted by the filter F1 is formed in digital form, but the oscillator VCO is to be driven by an analog signal, the digital/analog converter D/A is arranged between the two components.

If the two switches S1 and S2 occupy the position A, (no failure of the reference frequency signal $f_R$ and no overshooting of either of the threshold values $\Delta\phi s/\Delta t\phi s \; \Delta\phi s$) the phase difference value determined by the second phase comparator PB is switched through to the third filter F3. This phase difference value is obtained from the comparison of the frequency supplied to the two inputs $E1_{PB}$ and $E2_{PB}$, the internally-formed output frequency signal $f_A$ and the normal frequency signal $f_N$ generated by the normal frequency generator FNG. The stability of the normal frequency generator FNG is substantially greater than that of the oscillator VCO.

In the same manner as the first filter F1, the third filter F3 can likewise consist of a P-, PI-, or PID-filter.

It forms values derived from the phase difference value supplied by the second phase comparator PB. These values represent a measure of the frequency difference between the output frequency signal $f_A$, formed internally by the oscillator VCO, and the normal frequency signal $f_N$ formed by the normal frequency generator FNG. If this difference is equal to zero, the derived value is likewise zero.

The filter characteristic of the third filter F3 is determined in dependence upon the filter characteristic of the first filter F1; for example, the time constant of the filter F3 is substantially greater than the time constant of the regulating circuit which includes the filter F1. A typical value of the time constant of this regulating circuit is in the range of minutes. The time constant for the filter F3 is greater than the time constant of the regulating circuit, including the filter F1, by a factor exceeding 1, in particular a factor of up to 10.

In the switch position A, the further processing of the output values of the filter F3 is of no significance since the following, second filter F2 is not coupled to the oscillator VCO. In the event of a transfer into the switch position B (i.e., in the event of the failure of the reference frequency signal $f_R$ or the overshooting of either of the threshold values $\Delta\phi s/\Delta t$ or $\Delta\phi s$, the second filter F2 is coupled to the oscillator VCO. At the same time the filter F2 is supplied by way of a preceding subtractor with a difference value which comprises a difference between the phase difference value formed by the second phase comparator PB and the value held by the third filter F3 previously formed with a switch S1 in the switch position A.

With the switches S1 and S2 in the switch position B, which forms another regulating circuit with the elements PB, F2 and VCO, the filter F2 assumes the function of the filter F1 in the original regulating circuit and can therefore possess the same characteristics as the filter F1. Therefore, the sequence of control variables formed by the second filter F2 is supplied to the oscillator VCO, in the steady state, the difference value supplied to the filter F2 is regulated to zero. Also in the steady state, the sequence of control variables emitted by the second filter F2 is constant in the event of the failure of the reference frequency signal $f_R$ and the undisturbed operation of the oscillator VCO.

The circuit arrangement corresponding to the present invention comprising the highly-stable normal frequency generator FNG, the two phase comparators PA and PB, the filters F1, F2 and F3, the low-stability oscillator VCO, and the usual components, results in the fact that the stability of the generated clock signal or output frequency signal $f_A$ corresponds to the highly-stable frequency of the normal frequency signal $f_N$. The frequency of the output frequency signal $f_A$ following the failure of the reference frequency signal $f_R$ is then equal to the frequency of the last-supplied reference frequency signal $f_R$ and the mean frequency of the signal formed by the filter F3. Furthermore, a frequency deviation ($f_A$ unequal to $f_N$) on the order of the relatively-wide pull-in range of the oscillator VCO is permitted. A large frequency displacement is necessary in the event of the failure of the reference frequency signal $f_R$ in order to allow a frequency signal $f_A$ to be emitted which may differ substantially from the nominal frequency of the reference frequency signal $f_R$.

At the time of switching of the switches S1 and S2 into the switch position B, the filter F2 contains undefined filter values which, at the output end, lead to control variables for the oscillator VCO which can considerably delay the response process. In accordance with the present invention, upon the switching of the switches S1 and S2 into the switch position B, the current filter values which serve to form the control variables are transferred from the filter F1 to the filter F2. For this puprose, the filter F1 can be connected to the filter F2, as indicated in FIG. 1 by the arrow pointing from the filter F1 to the filter F2. At the time of the transfer, these filter values can be adopted, unchanged, as filter values for the filter F2 if the two filters F1 and F2 are of identical construction. Otherwise, the transferred filter values must be reformed appropriately.

Figure 2:
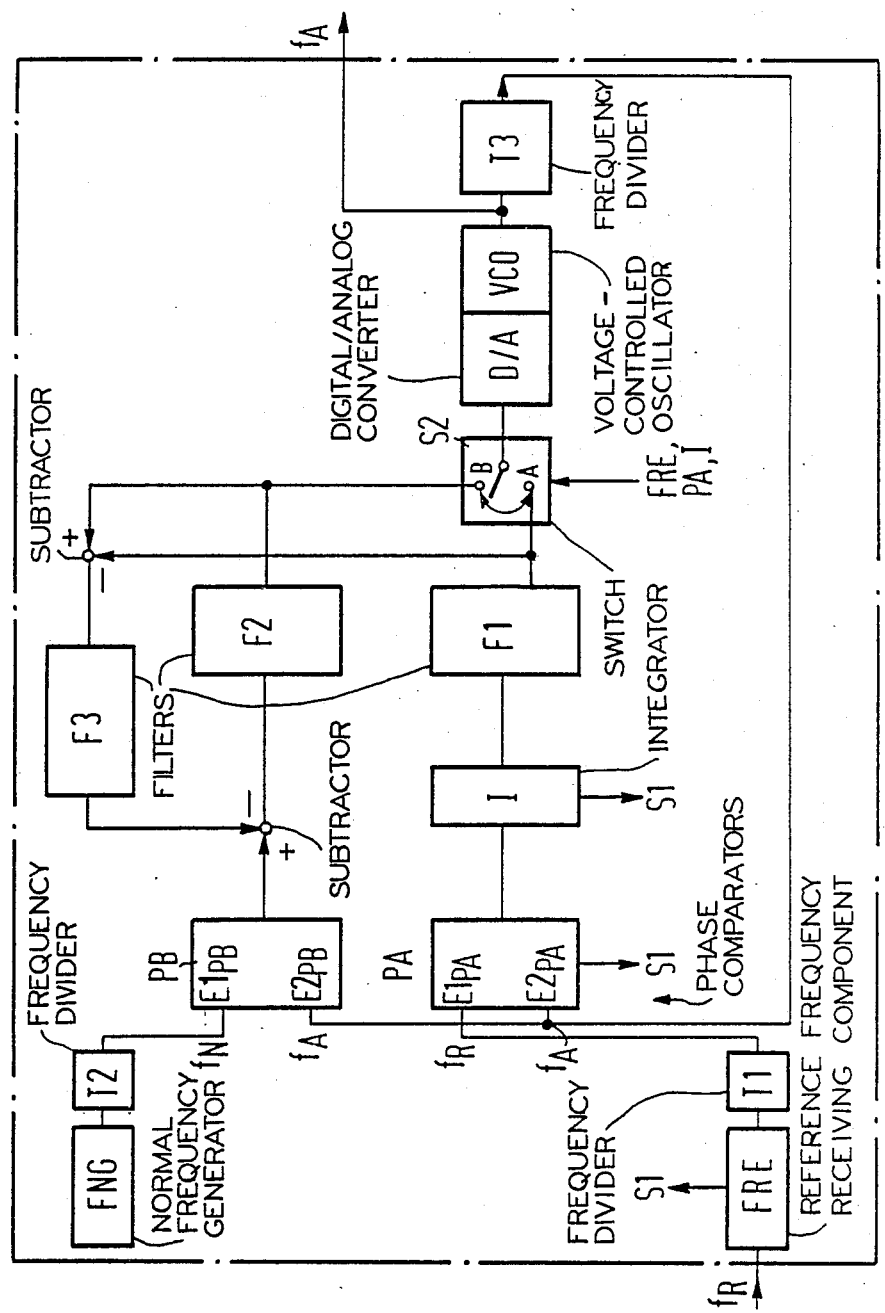
FIG. 2 is a schematic representation of a second circuit arrangement constructed in accordance with the present invention.

In the case of the second circuit arrangement constructed in accordance with the present invention and illustrated in FIG. 2, the transfer of the filter values from the filter F1 to the filter F2 is unnecessary. In contrast to the circuit arrangement illustrated in FIG. 1, in the circuit arrangement of FIG. 2, the first switch S1 has been omitted so that the second phase comparator PB and the second filter F2 are permanently connected to one another via the first subtractor which is arranged in the circuit shown in FIG. 1. A second subtractor, arranged at the output of the second and first filters F2 and F1, as shown in FIG. 2, leads to the input of the third filter F3.

The input value for the filter F3 is formed from the difference between the control variables generated by the filter F2 and the filter F1.

In the circuit arrangement shown in FIG. 1, at any one time, only one of the two regulating circuits (the first circuit including the components PA, I, F1 and VCO; the second circit including the components PB, F3, F2, VCO ) is utilized. In the event of a switch or transfer from the first to the second circuit it is necessary to transfer the filter values from the filter F1 to the filter F2, or undesired delays of the response process arise.

In the circuit arrangement illustrated in FIG. 2, in normal operation, in addition to the first regulating circuit comprises the components PA, I, F1, VCO, which is shown in the lower portion of FIG. 2 and which is identical to the first regulating circuit in FIG. 1, the circuit arrangement includes a regulating circuit shown in the upper part of FIG. 2 that is closed and regulates the difference between the control variables of the first and second filters F1 and F2 to zero.

The second filter F2 in each circuit arrangement forms the control variables to drive the oscillator VCO. In normal operation (switch position A), however, these control variables are not switched through to the oscillator VCO. Therefore, upon switching of the switch S2 from the position A to the position B, in the event of a disturbance, the filter immediately assumes the filter values of a steady filter without interruption and supplies the oscillator VCO with control variables which do not lead to a jump in the frequency of the output frequency signal $f_A$ at the time of transfer.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a circuit arrangement for generating a clock signal which is frequency-synchronous with respect to a supplied reference frequency, in which a reference frequency receiving component receives an external reference frequency signal and is connected to a first input of a first phase comparator, in which the first phase comparator is connected by way of an integrator to a first filter which is, in turn, connected to a voltage-controlled oscillator operable to emit the frequency-synchronous clock signal to an output of the circuit arrangement and to a second input of the first phase comparator the improvement comprising:

a second phase comparator including a first input and a second input, said second input connected to the output of said voltage-controlled oscillator;

a highly-stable normal frequency generator connected to said first input of said second phase comparator;

a first switch having two inputs, one of which is connected to an output of said second phase comparator and one of which is connected to at least one from the group consisting of said reference frequency receiving component, said first phase comparator, or said integrator, switching of said first switch being controlled by at least one of the group consisting of said first phase comparator, said first phase comparator, or said integrator, said first switch including first and second outputs such that upon failure of the reference frequency signal or overshooting of a predetermined phase difference between the reference frequency signal and the clock signal the first switch switches over from a first switching position to a second switching position respectively connected to said outputs;

a subtractor including a subtrahend input connected to said second phase comparator by said first switch and including a minuend input and an output;

a second filter connected to said output of said subtractor;

a third filter connected between said first output of said first switch and said minuend input of said subtractor; and a second switching element including first and second inputs, said first input connected to said first filter, said second switch connected to operate in synchronism with said first switch, said second input of said second switch connected to an output of said second filter, said second switch including an output connected to said voltage-controlled oscillator.

2. The improved circuit arrangement of claim 1, wherein:

said first filter is connected to said second filter such that in the event of the failure of the reference frequency or the overshooting of a predetermined phase difference between the reference frequency signal and the clock signal, filter values, formed in order to form the output value of the first filter, are transferred to the second filter.

3. The improved circuit arrangement of claim 1, wherein:

said second phase comparator is directly connected to said subtrahend input of said subtractor;

a second subtractor is provided and an input of said third filter is connected to an output of said second subtractor, said second subtractor including a subtrahend input connected to said output of said second filter and a minuend input connected to the output of said first filter.

* * * * *